(12) United States Patent
Hwang et al.

(10) Patent No.: US 10,598,837 B2
(45) Date of Patent: Mar. 24, 2020

(54) POLARIZING PLATE HAVING SPECIFIED RATIO OF TRIIODIDE IONS TO IODINE TO PENTAIODIDE IONS AND ORGANIC LIGHT-EMITTING DISPLAY DEVICE HAVING THE SAME

(71) Applicant: LG Display Co., Ltd., Seoul (KR)

(72) Inventors: Seonghan Hwang, Goyang-si (KR); Hyunjong Noh, Paju-si (KR); Youngwook Kim, Seoul (KR); Chimyung Ahn, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 225 days.

(21) Appl. No.: 15/696,313

(22) Filed: Sep. 6, 2017

(65) Prior Publication Data
US 2018/0120490 A1    May 3, 2018

(30) Foreign Application Priority Data

Oct. 31, 2016    (KR) .................. 10-2016-0143647

(51) Int. Cl.
| G02B 5/30 | (2006.01) |
| H01L 51/52 | (2006.01) |
| G09G 3/3225 | (2016.01) |
| G02F 1/1335 | (2006.01) |

(52) U.S. Cl.
CPC ......... *G02B 5/3025* (2013.01); *G02B 5/3083* (2013.01); *G09G 3/3225* (2013.01); *H01L 51/5293* (2013.01); *G02F 1/133528* (2013.01); *G09G 2300/0426* (2013.01)

(58) Field of Classification Search
CPC ... G02B 1/08; G02B 1/10; G02B 1/14; G02B 5/30–3091; G02F 1/133528; G09G 3/3225–3258; G09G 2300/0426; H01L 51/5281; H01L 51/5284; H01L 51/5293
USPC .............. 252/585; 349/96, 194; 359/487.01, 359/487.02, 487.05, 487.06, 489.01, 359/489.07; 427/163.1; 428/1.31
See application file for complete search history.

(56) References Cited

U.S. PATENT DOCUMENTS

| 4,166,871 A | * | 9/1979 | Schuler ................ G02B 5/3033 |
| | | | 359/487.02 |
| 2015/0042942 A1 | * | 2/2015 | Hatanaka ............. G02B 5/3016 |
| | | | 349/194 |

(Continued)

FOREIGN PATENT DOCUMENTS

| CN | 104375230 A | 2/2015 |
| CN | 105474055 A | 4/2016 |
| CN | 105824069 A | 8/2016 |

(Continued)

OTHER PUBLICATIONS

Chinese Office Action dated Oct. 8, 2019 issued in co-pending Chinese Patent Application No. 201711053994.3.

*Primary Examiner* — Ryan S Dunning
(74) *Attorney, Agent, or Firm* — Polsinelli PC

(57) ABSTRACT

Provided are a very highly transmissive polarizing plate which allows for improved luminance efficiency without reducing the degree of polarization by enhancing the color of the polarizing plate, and an organic light-emitting display device having the same. With this very highly transmissive polarizing plate, the brightness, lifetime, and efficiency of the organic light-emitting display device can be improved, and at the same time power consumption can be reduced.

20 Claims, 9 Drawing Sheets

| | COMPARATIVE EXAMPLE | | | TEST EXAMPLE | |
|---|---|---|---|---|---|
| TRANSMITTANCE(Ts) | 43% | 45% | 48% | 48% BLUE TUNING | 48% BLUE TUNING |
| RATE OF INCREASE IN TRANSMITTANCE(%) | 100 | 105 | 110 | 110 | 110 |
| COLOR(a*/b*) | -1.5/4.0 | -0.8/2.0 | -0.5/1.5 | -0.5/1.0 | 0.0/0.5 |
| EFFICIENCY(%) | 100 | 110 | 120 | 125 | 129 |

(56) References Cited

U.S. PATENT DOCUMENTS

2016/0341860 A1* 11/2016 Nojiri ............... G02F 1/133528
2017/0269271 A1* 9/2017 Hatanaka ............. G02B 5/3016

FOREIGN PATENT DOCUMENTS

| CN | 106033135 A | 10/2016 |
|---|---|---|
| JP | 2013174786 A | 9/2013 |

* cited by examiner

| | COMPARATIVE EXAMPLE | | | TEST EXAMPLE | |
|---|---|---|---|---|---|
| TRANSMITTANCE(Ts) | 43% | 45% | 48% | 48% BLUE TUNING | 48% BLUE TUNING |
| RATE OF INCREASE IN TRANSMITTANCE(%) | 100 | 105 | 110 | 110 | 110 |
| COLOR(a*/b*) | -1.5/4.0 | -0.8/2.0 | -0.5/1.5 | -0.5/1.0 | 0.0/0.5 |
| EFFICIENCY(%) | 100 | 110 | 120 | 125 | 129 |

FIG. 11A

| COMPARATIVE EXAMPLE 1 | W(F/W) | R | G | B | Ws |
|---|---|---|---|---|---|
| X | 0.2801 | 0.6659 | 0.3078 | 0.1371 | 0.3062 |
| Y | 0.2861 | 0.3330 | 0.6384 | 0.0607 | 0.3275 |
| Lv | 105.1 | 20.5 | 70.44 | 11.22 | 102.9 |
| A | 4.65 | 6.13 | 4.68 | 6.56 | 2.76 |
| EFFICIENCY (Cd/A) | 18.60 | 2.75 | 12.39 | 1.41 | 30.68 |
| RATE OF INCREASE IN EFFICIENCY | 100% | 100% | 100% | 100% | 100% |

FIG. 11B

| COMPARATIVE EXAMPLE 2 | W(F/W) | R | G | B | Ws |
|---|---|---|---|---|---|
| X | 0.2796 | 0.6652 | 0.3073 | 0.1372 | 0.3030 |
| Y | 0.2857 | 0.3334 | 0.6388 | 0.0600 | 0.3229 |
| Lv | 106.1 | 20.81 | 71.85 | 11.33 | 104.5 |
| A | 4.19 | 5.84 | 4.49 | 6.11 | 2.64 |
| EFFICIENCY (Cd/A) | 20.84 | 2.93 | 13.17 | 1.53 | 32.58 |
| RATE OF INCREASE IN EFFICIENCY | 112% | 107% | 106% | 108% | 106% |

FIG. 11C

| TEST EXAMPLE | W(F/W) | R | G | B | Ws |
|---|---|---|---|---|---|
| X | 0.2796 | 0.6663 | 0.3072 | 0.1375 | 0.3030 |
| Y | 0.2855 | 0.3326 | 0.6390 | 0.0599 | 0.3227 |
| Lv | 106.6 | 21.05 | 72.49 | 11.49 | 105.6 |
| A | 3.70 | 5.45 | 4.10 | 5.50 | 2.50 |
| EFFICIENCY (Cd/A) | 23.71 | 3.18 | 14.55 | 1.72 | 34.76 |
| RATE OF INCREASE IN EFFICIENCY | 127% | 115% | 117% | 122% | 113% |

FIG. 12

|  | COMPARATIVE EXAMPLE | | | | TEST EXAMPLE |
|---|---|---|---|---|---|
| COMPOSITION | Ts | 43 | 45 | 48 | 48 |
| TRANSMITTANCE | Ts(ACTUAL MEASUREMENT) | 42.8 | 44.8 | 48.0 | 48.0 |
| POLARIZATION | PE | 99.99 | 99.8 | 85.0 | 89.9 |
| REFLECTANCE OF OLED PANEL 30% ≤ R ≤ 40% | EFFICIENCY | 100 | 110 | 120 | 127 |
| | REFLECTANCE | 0.9 | 1.2 | 3.6 | 2.5 |
| REFLECTANCE OF OLED PANEL 15% ≤ R ≤ 25% | EFFICIENCY | – | 110 | 120 | 127 |
| | REFLECTANCE | 0.9 | 1.0 | 1.9 | 1.6 |
| AFTERIMAGE DURATION (%) | | 100 | 110 | – | 124 |

FIG. 13

| TRANSMITTANCE(%) | IODINE CONTENT(%) | DYE CONTENT(%) | CHANGE IN TRANSMITTANCE | AMOUNT OF SMUDGES |
|---|---|---|---|---|
| 48.1 | 100 | 0 | 9.0% | NG |
| 48.4 | 99.0 | 1.0 | 6.0% | NG |
| 47.8 | 98.3 | 1.7 | 2.2% | OK |
| 48.3 | 97.2 | 2.8 | 1.5% | OK |
| 48.1 | 96.4 | 3.6 | 1.3% | OK |

FIG. 14

| TRANSMITTANCE(%) | ADDITIVE CONTENT(%) | CHANGE IN TRANSMITTANCE | AMOUNT OF SMUDGES |
|---|---|---|---|
| 48.3 | 0 | 8.6% | NG |
| 48.0 | 1.3 | 7.1% | NG |
| 47.7 | 2.1 | 4.3% | NG |
| 47.6 | 3.5 | 2.4% | OK |
| 48.1 | 4.8 | 2.0% | OK |

FIG. 15

| TRANSMITTANCE(%) | STRETCH RATIO | CHANGE IN TRANSMITTANCE | AMOUNT OF SMUDGES |
|---|---|---|---|
| 48.3 | 1 | 9.0% | NG |
| 48.1 | 1.05 | 6.5% | NG |
| 47.8 | 1.1 | 5.5% | NG |
| 47.7 | 1.15 | 4.5% | CONFIRMED INCREASE |

POLARIZING PLATE HAVING SPECIFIED RATIO OF TRIIODIDE IONS TO IODINE TO PENTAIODIDE IONS AND ORGANIC LIGHT-EMITTING DISPLAY DEVICE HAVING THE SAME

CROSS-REFERENCE TO RELATED APPLICATION

Pursuant to 35 U.S.C. § 119(a), this application claims the benefit of an earlier filing date of and the right of priority to Korean Application No. 10-2016-0143647, filed on Oct. 31, 2016, the contents of which are incorporated by reference herein in its entirety.

BACKGROUND

Field of the Disclosure

The present disclosure relates to a display device, and more particularly, to a polarizing plate and an organic light-emitting display device having the same. Although the present disclosure has a wide scope of applications, it is particularly suitable for improving luminance efficiency of a polarizing plate for an organic light-emitting display device.

Description of the Background

With the growing interest in information displays and the increasing demand for use of portable information mediums, research and commercialization of flat-panel displays (FPDs) replacing traditional cathode ray tubes (CRTs) have been conducted intensively.

In the field of flat-panel displays, liquid-crystal display devices (LCDs), which are lightweight and have low power consumption, are a type of displays that have received the most attention so far. However, liquid-crystal displays are not light-emitting elements but light receiving elements, and have disadvantages in terms of brightness, contrast ratio, viewing angle, etc. In this regard, new display devices have been actively under development that can overcome these disadvantages.

Organic light-emitting displays, one of these new display devices, are enabling to implement a wider viewing angle and greater contrast ratio compared to liquid-crystal displays because they are self-emissive. Moreover, they require no backlighting; thus, they can be made lightweight and thin and benefit in terms of power consumption. In addition, they can operate on low-voltage direct current and have fast response time.

An organic light-emitting display device has sub-pixels with organic light-emitting diodes arranged in a matrix form, and displays an image by selectively controlling the sub-pixels by data voltage and scan voltage.

In this case, the organic light-emitting display device can be classified as a passive-matrix scheme or an active-matrix scheme which uses thin-film transistors (TFTs) as switching devices. In the active-matrix scheme, the TFTs, which are active elements, are selectively turned on to select sub-pixels, and the sub-pixels are kept lit by the voltage stored in the storage capacitor.

A typical organic-light emitting display operating in this way has a circular polarizer applied to the top surface of a panel assembly to reduce reflections from various metallic wires or electrodes.

FIG. 1 is a schematic view of a structure of a typical organic light-emitting display device.

FIG. 2 is a graph showing the change in the degree of polarization with respect to transmittance of a typical polarizing plate.

Referring to FIG. 1, a circular polarizer including a quarter-wave plate 61 and a linear polarizing plate 62 (hereinafter, referred to as "polarizing plate" for convenience) is formed on the top surface of a panel assembly 2, in order to reduce reflections.

A protective layer 63 is attached on the top of the polarizing plate 62.

Such a conventional organic light-emitting display device have a low visibility in the outdoors due to the increased reflectance from organic light-emitting diodes and various wires or electrodes and make wires or electrode patterns visible. The circular polarizer is applied to improve this problem.

That is, the quarter-wave plate 61 and the polarizing plate 62 are placed on the top of the panel assembly 2 so that the optical axis of the quarter-wave plate 61 and the transmission axis of the polarizing plate 62 are at 45 degrees to each other. This way, when external light is reflected within the panel assembly 2 and the reflected light exits it, it becomes orthogonal to the transmission axis of the polarizing plate 62, thereby reducing the reflectance. For reference, reflectance is a function of refractive indices, and the higher the ratio of the refractive indices, the higher the reflectance. The refractive index of air is 1 and the refractive index of glass is 1.5. Thus, when light enters the front of a glass from air, about 4% of the light is reflected.

However, in the case of FIG. 1, the brightness of the organic light-emitting display device decreases by a minimum of 50%. That is, the transmittance of the polarizing plate 62 is about 40 to 50%, and the brightness of light produced from the organic light-emitting diodes decreases by 50% or more as it passes through the polarizing plate 62.

Referring to FIG. 2, the transmittance and degree of polarization of the conventional polarizing plate are usually fixed. Liquid-crystal displays generally require a transmittance of 43% and a degree of polarization of 99.99% or higher. A high degree of polarization is required to increase the contrast ratio (CR) of the liquid crystal panel since liquid-crystal displays use liquid crystals. That is, a transmittance of more than 43% is difficult to achieve when the degree of polarization should be 99.99% or higher.

In an example, the degree of polarization of a high-transmittance polarizing plate with 45% transmittance is reduced to 99.8%, and the degree of polarization of a high-transmittance polarizing plate with 48% transmittance is reduced to 85.0%. Thus, these polarizing plates cannot be used in liquid-crystal displays.

In the case of organic light-emitting displays, development is underway to reduce the reflectance of the display panel and improve brightness. For organic light-emitting displays, brightness is an important factor affecting lifetime and efficiency. However, the use of a conventional polarizing plate with 43% transmittance involves difficulties in enhancing the luminance efficiency of the organic light-emitting display because improvements in transmittance are necessary to enhance the luminance efficiency.

SUMMARY

The present disclosure has been made in an effort to provide a very highly transmissive polarizing plate which allows for improved luminance efficiency without reducing the degree of polarization and an organic light-emitting display device having the same.

Another aspect of the present disclosure is to provide a polarizing plate with improved reliability and an organic light-emitting display device having the same.

Other aspects and features of the present disclosure will become apparent to those ordinarily skilled in the art upon reviewing the following description of aspects of the present disclosure and the claims.

An exemplary aspect of the present disclosure provides a polarizing plate with a transmittance of 45% or higher, in which a ratio of triiodide ions $I_3^-$ to iodine $I_2$ and pentaiodide ions $I_5^-$ is 15% or higher and lower than 20%.

The organic light-emitting display device according to the exemplary aspect of the present disclosure may include a phase difference layer and the polarizing plate that are sequentially stacked on a substrate.

The ratio of triiodide ions $I_3^-$:iodidine ($I_2$):pentaiodide ions $I_5^-$ may be 15:40:45 to 19:40:41.

Chromaticity coordinates a*/b* may have values of –0.5/1.5 to 0.0/0.0.

A dye may be added to the iodine at a rate of about 1.7% or more.

The dye used may be a black dye, which is obtained by mixing three or more dyes of CMY (or RGB) colors.

Additives may be added to the iodine at a rate of 3.5% or more.

The additives may include metal compounds such as zinc (Zn), chlorine (Cl), and platinum (Pt).

The zinc compounds may include zinc chloride, zinc iodide, zinc sulfate, zinc nitride, and zinc acetate.

The phase difference layer may include a quarter-wave plate (QWP) that induces ë/4 phase retardation According to an exemplary aspect of the present disclosure, there are provided a very highly transmissive polarizing plate which allows for improved luminance efficiency without reducing the degree of polarization by enhancing the color of the polarizing plate, and an organic light-emitting display device having the same. With this very highly transmissive polarizing plate, the brightness, lifetime, and efficiency of the organic light-emitting display device can be improved, and at the same time power consumption can be reduced.

Moreover, the polarizing plate and organic light-emitting display device according to the exemplary aspect of the present disclosure offer the advantages of expanding product lines and meeting consumer needs by adapting a polarizing plate optimized for brightness and reflectance to products with varying degrees of reflection.

BRIEF DESCRIPTION OF THE DRAWINGS

The accompanying drawings, which are included to provide a further understanding of the disclosure and are incorporated in and constitute a part of this specification, illustrate exemplary aspects and together with the description serve to explain the principles of the disclosure.

In the drawings:

FIGS. 11A to 11C are tables showing luminance efficiency characteristics for different transmittance rates of polarizing plates;

FIG. 12 is a table showing degree of polarization, reflectance, and afterimage duration of a polarizing plate according to an aspect of the present disclosure;

FIG. 13 is a table showing reliability results for different iodine contents and dye contents:

FIG. 14 is a table showing reliability results for different additive contents; and FIG. 15 is a table showing reliability results for different stretch ratios.

DETAILED DESCRIPTION

Figure 1:
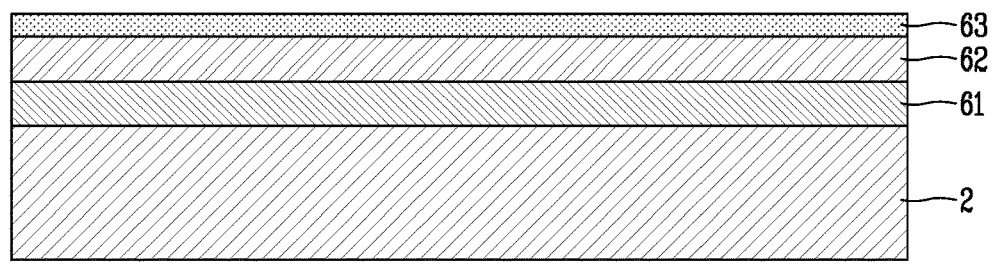
FIG. 1 is a schematic view of a structure of a typical organic light-emitting display device.
Figure 2:
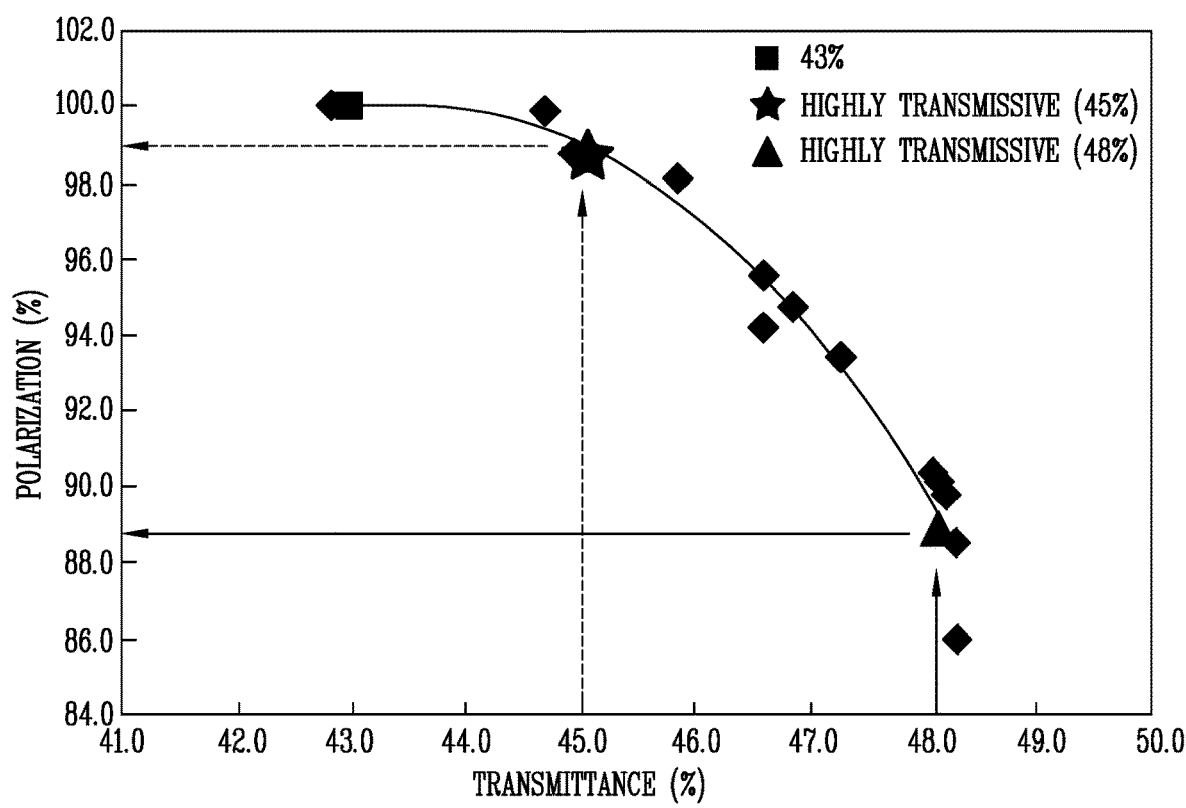
FIG. 2 is a graph showing the change in the degree of polarization with respect to transmittance of a typical polarizing plate.

Hereinafter, a polarizing plate and an organic light-emitting display device having the same according to an exemplary aspect of the present disclosure will be described in sufficient detail to enable a person of ordinary skill in the art to readily practice the disclosure.

Advantages and features of the present disclosure and methods of accomplishing the same may be understood more readily by reference to the following detailed description of preferred aspects and the accompanying drawings. The present disclosure may, however, be embodied in many different forms and should not be construed as being limited to the aspects set forth herein. Rather, these aspects are provided so that this disclosure will be thorough and complete and will fully convey the concept of the disclosure to those skilled in the art, and the present disclosure will only be defined by the appended claims. Like numbers refer to like elements throughout the specification. In the drawings, the sizes and relative sizes of layers and regions may be exaggerated for clarity.

It will be understood that when an element or a layer is referred to as being "on" or "above" another element or layer, it can be directly on or above the other element or layer or intervening elements or layers may be present. In contrast, when an element or a layer is referred to as being "directly on" or "directly above" another element or layer, there are no intervening elements or layers present.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if an element illustrated in the drawings is turned over, the element described to be "below" or "beneath" another element may be put "above"

the other element. Accordingly, the exemplary wording "below" may include both directions corresponding to "below" and "above".

The terms used in the present specification are used to describe example aspects of inventive concepts, and not to limit the inventive concepts. A singular form may include a plural form, unless otherwise defined. The terms "comprise" and/or "comprising" specify the existence of mentioned components, steps, operations and/or elements thereof, and do not exclude the existence or addition of one or more components, steps, operations and/or elements thereof.

Figure 3:
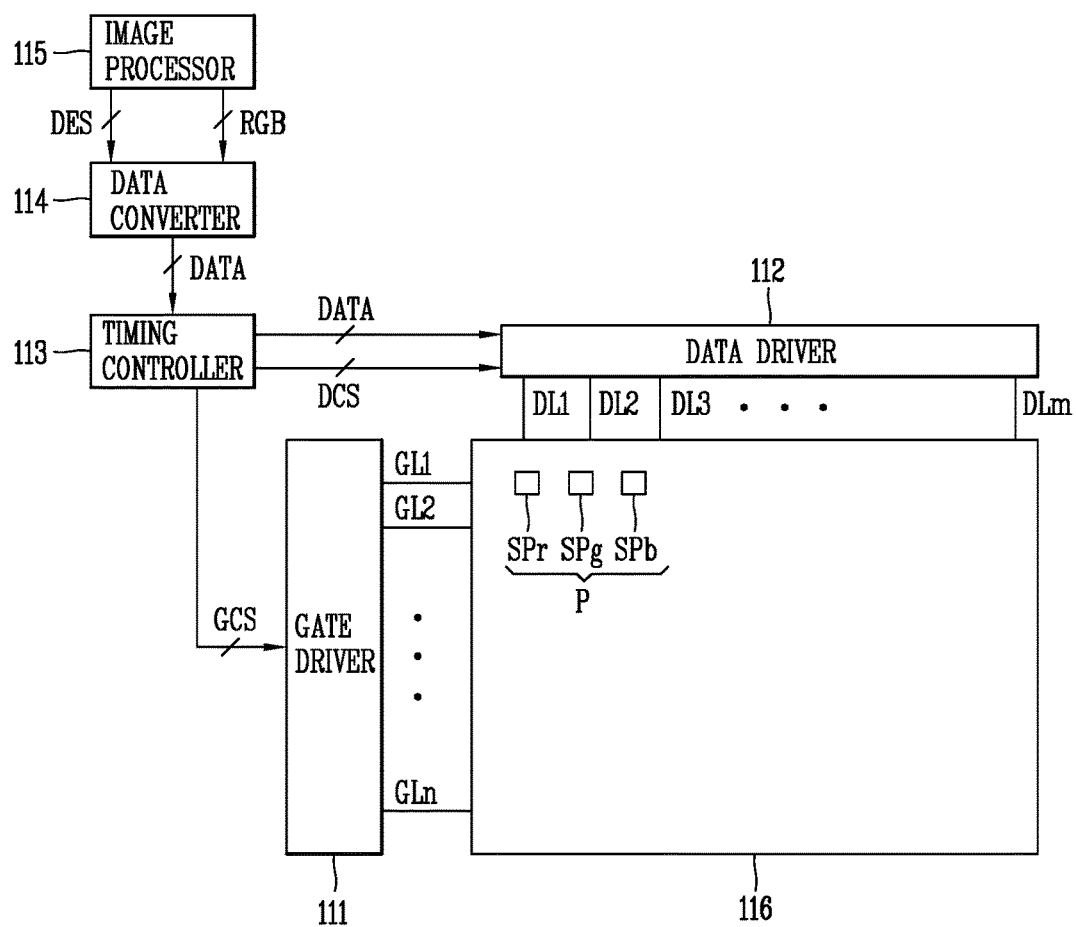
FIG. 3 is a block diagram schematically showing an organic light-emitting display device according to an exemplary aspect of the present disclosure.

FIG. 3 is a block diagram schematically showing an organic light-emitting display device according to an aspect of the present disclosure.

Referring to FIG. 3, the organic light-emitting display device may include an image processor 115, a data converter 114, a timing controller 113, a data driver 112, a gate driver 111, and a display panel 116.

The image processor 115 performs a variety of image processing tasks, including setting a gamma voltage, and outputting RGB data signals RGB, in order to achieve full brightness relative to the average picture level using the RGB data signals RGB. As well as the RGB data signals RGB, the image processor 115 outputs driving signals including one or more of the following: a vertical synchronization signal Vsync, a horizontal synchronization signal Hsync, a data enable signal DES, and a clock signal CLK.

From the image processor 115 or data converter 114, the timing controller 113 receives driving signals including one or more of the following: a vertical synchronization signal Vsync, a horizontal synchronization signal Hsync, a data enable signal DES, and a clock signal CLK. The timing controller 113 outputs a gate timing control signal GCS for controlling the operation timing of the gate driver 111 and a data timing control signal DCS for controlling the operation timing of the data driver 1112, based on the driving signals.

The timing controller 113 outputs a data signal DATA corresponding to the gate timing control signal GCS and the data timing control signal DCS.

The data driver 112 samples and latches the data signal DATA supplied from the timing controller 113 in response to the data timing control signal DCS supplied from the timing controller 113, and converts it to output a gamma reference voltage. The data driver 112 outputs the converted data signal DATA through data lines DL1 to DLm. The data driver 112 comes in the form of an integrated circuit.

The gate driver 111 outputs a gate signal while shifting the level of gate voltage in response to the gate timing control signal GCS supplied from the timing controller 113. The gate driver 111 outputs the gate signal through gate lines GL1 to GLn. The gate driver 111 comes in the form of an IC or is provided on the display panel 116 in a gate-in-panel (GIP) manner.

The display panel 116 may be implemented in a sub-pixel structure including a red sub-pixel SPr, a green sub-pixel SPg, and a blue sub-pixel SPb. That is, a single pixel P may include RGB sub-pixels SPr, SPg, and SPb. However, the present disclosure is not limited to this structure, and a white sub-pixel may be added to the RGB sub-pixels SPr, SPg, and SPb.

Figure 4:
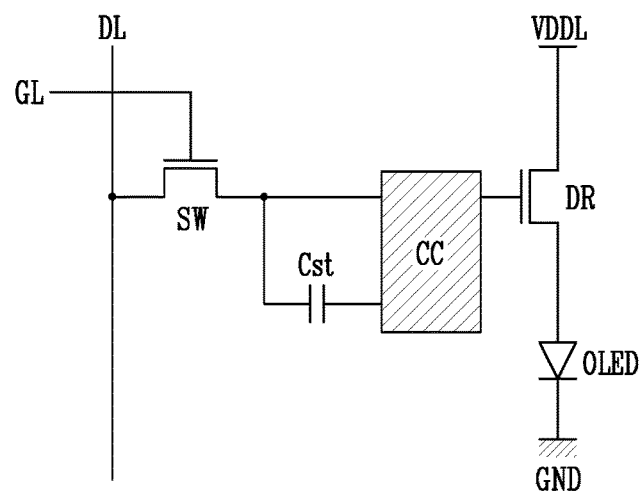
FIG. 4 is a circuit configuration for sub-pixels on an organic light-emitting display device.

FIG. 4 is a circuit configuration for sub-pixels on an organic light-emitting display device.

The sub-pixel illustrated in FIG. 4 has a 2T (transistor)-1C (capacitor) structure, for example, including a switching transistor, a driving transistor, a capacitor, and an organic light-emitting diode. However, the present disclosure is not limited to this structure, and the sub-pixel may have various structures such as 3T-1C, 4T-2C, and 5T-2C as long as a compensation circuit is added.

Referring to FIG. 4, in the organic light-emitting display device, a sub-pixel region is defined by a gate line GL arranged in a first direction and a data line DL and a driving power supply line VDDL arranged in a second direction perpendicular to the first direction, at a distance from each other.

A sub-pixel may include a switching transistor SW, a driving transistor DR, a capacitor Cst, a compensation circuit CC, and an organic light-emitting diode OLED.

The organic light-emitting diode OLED operates to emit light by a driving current formed by the driving transistor DR.

The switching transistor SW operates as a switch to store a data signal supplied through the data line DL as a data voltage in the capacitor Cst, in response to a gate signal supplied through the gate line GL.

The driving transistor DR operates to allow a driving current to flow between the driving power supply line VDDL and a ground wire GND by the data voltage stored in the capacitor Cst.

The compensation circuit CC compensates the threshold voltage, etc. of the driving transistor DR. The compensation circuit CC may include one or more transistors and a capacitor. The compensation circuit CC may be configured in various ways, so a concrete example and description thereof will be omitted.

The organic light-emitting display device having the above sub-pixel structure may be formed as top-emission type, bottom-emission type, or dual-emission type, depending on the direction of light emission. However, the present disclosure is not limited to these light-emission types.

Figure 5:
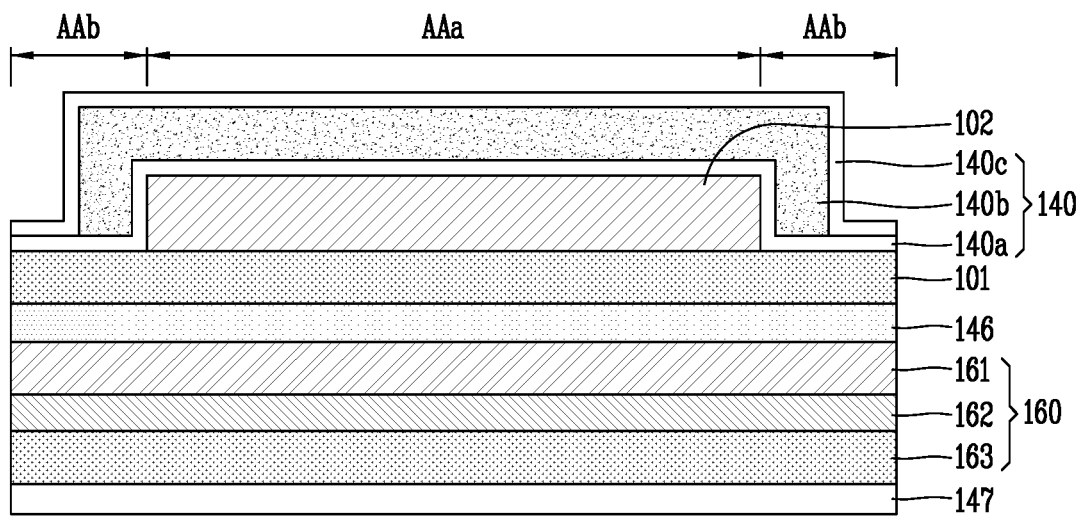
FIG. 5 is a cross-sectional view of a structure of an organic light-emitting display device according to an aspect of the present disclosure.

FIG. 5 is a cross-sectional view of an organic light-emitting display device according to an aspect of the present disclosure, which illustrates a cross-sectional structure of a panel assembly in an active region.

The organic light-emitting display device according to an aspect of the present disclosure may include a panel assembly displaying images and a flexible circuit substrate connected to the panel assembly.

The panel assembly may include a panel portion divided into an active region and a pad region, and a thin-film encapsulation layer covering the active region and provided on the panel portion.

Referring to FIG. 5, the panel portion may be placed on the top surface of a substrate 101.

The substrate 101 may be a flexible substrate.

The flexible substrate may be made of a plastic material with excellent heat resistance and durability, such as polyethylene terephthalate (PET), polyethylene naphthalate (PEN), polycarbonate (PC), polyarylate, polyetherimide (PEI), polyethersulphone (PES), and polyimide. However, the present disclosure is not limited to these materials, and a variety of flexible materials may be used.

In the case of bottom-emission devices which produce images in the direction of the substrate 101 as an aspect of the present disclosure, the substrate 101 needs to be made of a transparent material. However, the present disclosure is not limited to this type, and top-emission devices which produce images in the opposite direction of the substrate 101, in which case the substrate 101 is not necessarily made of a transparent material.

The active region may be divided into a pixel area AAa in which a plurality of sub-pixels are arranged to display an image, and a peripheral area AAb formed around the pixel area AAa to deliver an externally applied signal into the pixel area AAa.

The thin-film encapsulation layer 140 may be formed on the panel portion, covering part of the pixel area AAa and peripheral area AAb.

Although not shown, sub-pixels are arranged in a matrix form in the active region, and driving elements, such as a scan driver and a data driver for driving the pixels, and other parts may be located on the outer side of the active region.

Furthermore, a panel element 102 may be placed on the top surface of the substrate 101. The term "panel element" 102, as used herein, commonly refers to organic light-emitting diodes and a TFT array for driving them.

Although not shown, each sub-pixel includes an organic light-emitting diode and an electron elements electrically connected to the organic light-emitting diode. The electron elements may include at least two TFTs, a storage capacitor, etc. The electron elements are electrically connected to wires and driven by electrical signals received from the driving elements outside the panel portion. The arrangement of the electron elements and wires electrically connected to the organic light-emitting diodes is called a TFT array.

An organic light-emitting diode includes a first electrode, an organic compound layer, and a second electrode.

The organic compound layer may include an emissive layer where light emission occurs, and further include various organic layers for efficiently transporting carriers, either holes or electrons, to the emissive layer.

The organic layers may include a hole injection layer and a hole transport layer disposed between the first electrode and the emissive layer, and an electron injection layer and an electron transport layer disposed between the second electrode and the emissive layer.

In this way, a first electrode made of a transparent oxide may be formed on the TFT array, and an organic compound layer and a second electrode may be sequentially stacked on the first electrode.

Based on this structure, a hole injected from the first electrode and an electron injected from the second electrode pass through their transporting layers, and those are recombined in the emissive layer, at which point the electron moves down to a lower energy level, and the organic light-emitting diode produces light of a wavelength corresponding to the difference in energy in the emissive layer.

In this case, organic light-emitting display devices are classified into OLED devices that emit RGB light separately, OLED devices using white OLEDs (hereinafter, "WOLEDs") and RGB color filters, and color conversion-type OLED devices, depending on the method of full-color representation. Those that emit RGB light separately offer advantages such as high efficiency and high color purity, but cannot be used for large-area devices due to their low resolution.

By contrast, the white OLED devices using WOLEDs and RGB color filters have a high resolution, and are suitable for large-area devices due to the ease of processing. However, the present disclosure is not limited to these types of OLED devices.

The TFTs basically include a switching transistor and a driving transistor.

The switching transistor is connected to a scan line and a data line, and transmits a data voltage input into the data line to the driving transistor in response to a switching voltage input into the scan line. The storage capacitor is connected to the switching transistor and a power supply line, and stores the voltage corresponding to the difference between the voltage received from the switching transistor and the voltage supplied to the power supply line.

The driving transistor is connected to the power supply line and the storage capacitor and supplies an output current proportional to the square of the difference between the voltage stored in the storage capacitor and a threshold voltage, and the organic light-emitting diode emits light by the output current.

The driving transistor includes an active layer, a gate electrode, and source/drain electrodes, and the first electrode of the organic light-emitting diode may be connected to the drain electrode of the driving transistor.

In an example, the driving transistor may include an active layer formed over a buffer layer and a first insulating layer formed on the substrate 101 where the active layer is formed. Furthermore, the driving transistor may include a gate electrode formed on the first insulating layer, a second insulating layer formed on the substrate 101 where the gate electrode is formed, and source/drain electrodes formed on the second insulating layer and electrically connected to the source/drain regions of the active layer via a first contact hole.

A third insulating layer may be formed on the substrate 101 where the driving transistor is formed.

Moreover, color filters may be formed on the third insulating layer. The color filter of each sub-pixel may be one of red, green, and blue. A sub-pixel that creates white may have no color filter. The arrangement of red, green, and blue may vary, and a black matrix made of a material that can absorb external light may be provided between each color filter.

In the bottom-emission type, the color filters may be located below the first electrode.

A fourth insulating layer may be formed on the substrate 101 where the color filters are formed.

In this case, the drain electrode of the driving transistor may be electrically connected to the first electrode via a second contact hole formed in the third and fourth insulating layers.

A bank may be formed at the boundary of each sub-pixel area, on the fourth insulating layer. That is, the bank has a matrix-like lattice structure across the substrate 101, surrounds the edge of the first electrode, and exposes part of the first electrode.

The above-described organic compound layer of the organic light-emitting diode may be formed over the entire surface of the substrate 101. In this case, patterning may be omitted, which makes the process easier. However, the present disclosure is not limited to this, and the organic compound layer may be formed on the first electrode between the banks.

The second electrode is formed on the organic compound layer in the display region.

A capping layer made of an organic material such as polymer may be formed over the entire substrate 101 in the pixel area where the second electrode is formed. However, the present disclosure is not limited to this, and no capping layer may be formed.

Referring back to FIG. 5, a thin-film encapsulation layer 140 for covering the panel element 102 may be formed on the top surface of the substrate 101 where the second electrode is formed. The organic light-emitting diode included in the panel element 102 may be made of organic materials and may easily be degraded to moisture or oxygen from the outside. Thus, the panel element 102 needs to be sealed to protect the organic light-emitting diode. The thin-film encapsulation layer 140 is a means of sealing the panel element 102 and has a stacked structure of alternating inorganic and organic films. By sealing the panel element 102 with the thin-film encapsulation layer 140, rather than with an encapsulation substrate, the organic light-emitting display device can be made thin and flexible. However, the present disclosure is not limited to this.

To give a detailed explanation of the thin-film encapsulation layer 140, a first passivation film 140a, an organic film 140b, and a second passivation film 140c, as encapsulation, may be sequentially formed on the substrate 101 where the panel element 102 is provided, thereby constituting the thin-film encapsulation layer 140. However, as stated previously, the number of inorganic films and organic films constituting the thin-film encapsulation layer 140 is not limited to this example.

The first passivation film 140a may include an inorganic insulating film and thus does not provide good stack coverage due to the stepped portions (or step coverage) on the underlying TFTs, whereas the second passivation film 140c is not affected by the stepped portions on the underlying film since the organic film 140b located over the first passivation film 140a functions to planarize the surface. Moreover, the organic film 140b made of polymer is thick enough to fill cracks from impurities.

In the pad region of the panel assembly constructed in this way, an integrated circuit chip (not shown) may be mounted by a chip-on-glass (COG) method.

Electron elements (not shown) for processing driving signals may be mounted to the flexible circuit substrate by the chip-on-film (COF) method, and connectors (not shown) may be provided to transmit external signals to the flexible circuit substrate.

The flexible circuit substrate may be configured to be folded towards the back of the panel assembly to make the flexible circuit substrate face the backside of the panel assembly. In this case, an anisotropic conductive film (not shown) may be used to electrically connect a terminal part of the panel portion and a connection part of the flexible circuit substrate.

In the organic light-emitting display device according to an aspect of the present disclosure constructed in this way, in the case of bottom-emission type, an optical member 160 according to an aspect of the present disclosure may be provided on the backside of the substrate 101 to prevent reflections of light coming from the outside.

An adhesive layer 146 which is transparent and has adhesive properties may be interposed between the substrate 101 and the optical member 160.

The optical member 160 serves to minimize loss of light emitted from the organic light-emitting diode while improving the visibility of the organic light-emitting display device by suppressing external light reflections.

The optical member 160 according to an aspect of the present disclosure may include a phase difference layer 161 and a linear polarizing plate 162 (hereinafter referred to as "polarizing plate", for convenience).

A passivation layer 163 may be added onto the polarizing plate 162.

Furthermore, a surface treatment layer 147 including an antireflection (AR) film may be added onto the passivation layer 163. The antireflection film may be formed using an anti-reflection coating, which is a wet method, or using an antireflection sputter, which is a dry method.

The phase difference layer 161 may include a quarter-wave plate (QWP) that induces ë/4 phase retardation.

The polarizing plate 162 has a polarization axis, and linearly polarizes light in the direction of the polarization axis. Specifically, the polarizing plate 162 allows light parallel to the polarization axis to pass through, and absorbs light of other polarizations. Accordingly, when light passes through the polarizing plate 162, it is linearly polarized in the direction of the polarization axis.

The phase difference layer 161 may have an optical axis which is at 45 degrees with respect to the polarization axis of the polarizing plate 162.

The phase difference layer 161 and the polarizing plate 162 may constitute a circular polarizer. That is, when the optical axis of the phase difference layer 161 and the transmission axis of the polarizing plate 162 are placed at 45 degrees to each other, reflection occurs within the panel element 102 due to external light, and when the reflected light exits the panel element, it becomes orthogonal to the transmission axis of the polarizing plate 162, thereby reducing the reflectance.

The organic light-emitting display device according to an aspect of the present disclosure is provided to improve the transmittance of the polarizing plate 162, which is normally used for OLED devices. The improvement in transmittance of a polarizing plate can increase the brightness of the organic light-emitting display device, leading to a longer lifetime and better luminance efficiency.

In an example, in the case of an organic light-emitting display device with a panel reflectance of 50% or lower, a luminance efficiency of 10% or higher and a reflectance of 1.x % may be achieved from a polarizing plate with 46% transmittance and 95% polarization. Also, a luminance efficiency of 20% or higher and a reflectance of 3.x % may be achieved from a polarizing plate with 48% transmittance and 85% polarization.

In the present disclosure, the transmittance of the polarizing plate is that of a polarizing plate that underwent no surface treatment.

In the case of an organic light-emitting display device with a panel reflectance of 15%, a luminance efficiency of 20% or higher and a reflectance of 1.x % may be achieved from a polarizing plate with 48% transmittance and 85% polarization.

Particularly, in the organic light-emitting display according to an aspect of the present disclosure, a very highly transmissive polarizing plate 162 with improved luminance efficiency can be obtained without reducing the degree of polarization by enhancing the color of the polarizing plate 162 to turn it bluish (hereinafter, "blue tuning"). With the highly transmissive polarizing plate 162, the present disclosure can improve the brightness of the organic light-emitting display device, thereby achieving a longer lifetime and efficiency and reducing power consumption.

Moreover, the organic light-emitting display device according to an aspect of the present disclosure offers the advantages of expanding product lines and meeting consumer needs by adapting a polarizing plate optimized for brightness and reflectance to products with varying degrees of reflection.

For example, the polarizing plate according to an aspect of the present disclosure may have a transmittance of 45% or higher and a degree of polarization of 89.9% or higher.

Since the organic light-emitting display device is not sensitive to a contrast ratio as described above, it can maintain its contrast ratio even with a lower degree of polarization compared to liquid-crystal displays. Moreover, when the color of the polarizing plate is enhanced by blue tuning, as an aspect of the present disclosure, this contributes to luminance efficiency in full-color (WRGB) operation, thereby improving transmittance. Hereupon, the reflectance is increased, but only for blue wavelengths, and is thus almost the same at all wavelengths.

Figure 6:
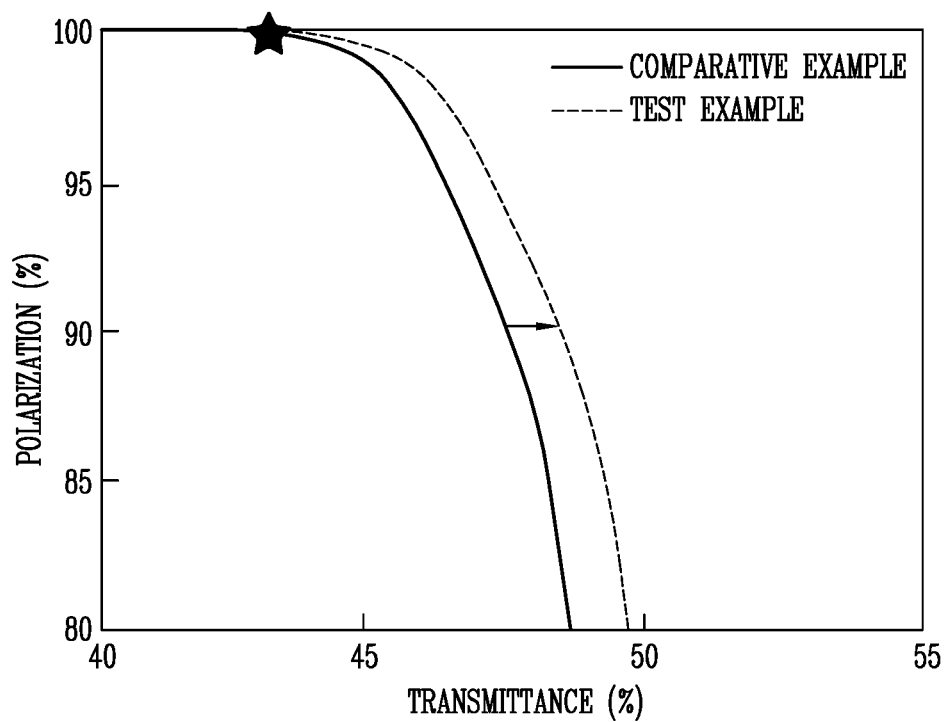
FIG. 6 is a graph showing the change in the degree of polarization with respect to transmittance of a polarizing plate according to an aspect of the present disclosure.

FIG. 6 is a graph showing the change in the degree of polarization with respect to transmittance of a polarizing plate according to an exemplary aspect of the present disclosure.

The solid line indicated in FIG. 6 represents the change in the degree of polarization with respect to transmittance of a conventional polarizing plate (Comparative Example), whereas the dotted line represents the change in the degree of polarization with respect to transmittance of a polarizing plate according to an aspect of the present disclosure (Test Example).

Referring to FIG. 6, the polarizing plate according to Test Example that underwent blue tuning exhibited better polarization at the same transmittance compared to Comparative Examples.

The star in the graph shows polarizing plates with 43% transmittance and 99.99% or higher polarization, which are typically used in display devices.

Figures 7, 8:
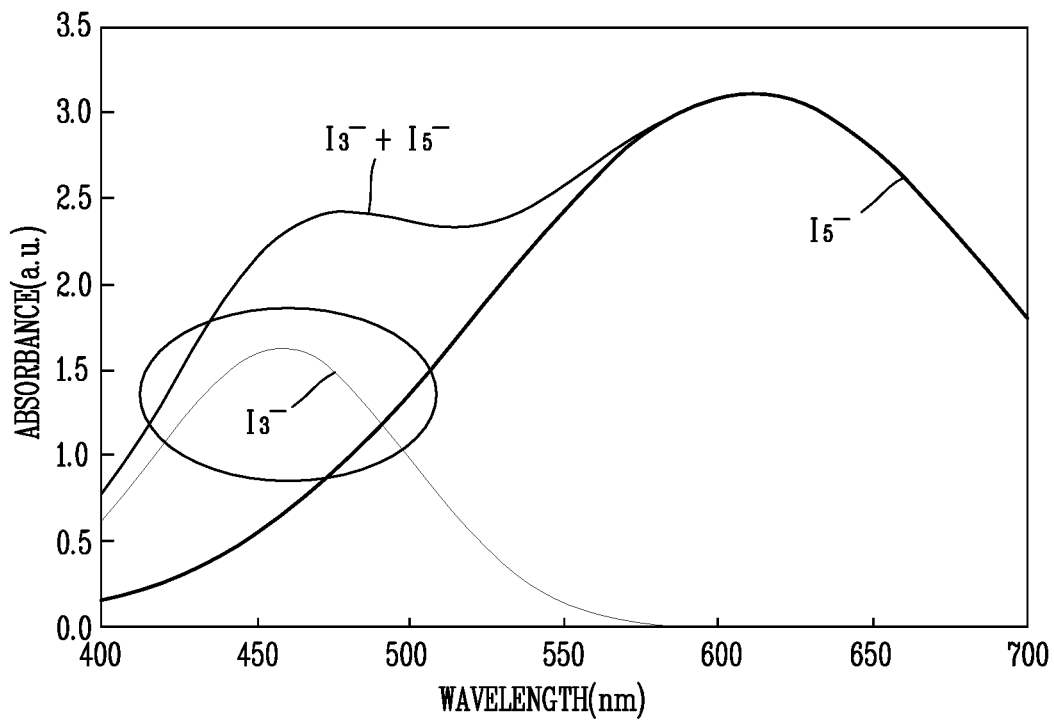
FIG. 7 is a table showing color enhancements and increases in transmittance and efficiency of polarizing plates according to an aspect of the present disclosure.
FIG. 8 is a graph showing an iodine absorption spectrum.

FIG. 7 is a table showing color enhancements and increases in transmittance and efficiency of the polarizing plates according to an aspect of the present disclosure.

Comparative examples are given for polarizing plates with 43%, 45%, and 48% transmittance, and Test examples are given for color-enhanced polarizing plates which are obtained by blue-tuning a polarizing plate with 48% transmittance.

Referring to FIG. 7, the chromaticity coordinates a*/b* of the polarizing plate with 43% transmittance of Comparative Example 1 are −1.5/4.0.

The chromaticity coordinates a*/b* of the polarizing plate with 45% transmittance of Comparative Example 2 are −0.8/2.0.

The chromaticity coordinates a*/b* of the polarizing plate with 48% transmittance of Comparative Example 3 are −0.5/1.5.

This reveals that the transmittance of the polarizing plates of Comparative Examples 2 and 3 increased by 105% and 110%, respectively, and their efficiency increased by 110% and 120%, respectively, compared to the polarizing plate of Comparative Example 1.

In comparison, the chromaticity coordinates a*/b* of the blue-tuned polarizing plate of Test Example 1 are −0.5/1.0, and the chromaticity coordinates a*/b* of the blue-tuned polarizing plate of Test Example 2 are 0.0/0/5.

This reveals that the transmittance of the polarizing plates of Test Examples 1 and 2 increased by 110% and their efficiency increased by 125% and 129%, respectively, compared to the polarizing plate of Comparative Example 1.

The efficiency was measured relative to 10000K for full-color (WRGB) operation.

From above, it is found out that, as the color of a polarizing plate turns bluish by blue tuning, the efficiency increases gradually even with the same transmittance.

The blue tuning of the polarizing plate may be achieved by controlling an iodine concentration, and a polyvinyl alcohol (PVA) film treated with iodine may be used a polarizer.

FIG. 8 is a graph showing an iodine absorption spectrum.

In the present disclosure, in order to enhance the color of a polarizing plate to turn it bluish, the concentration of triiodide ions $I_3^-$ is reduced, and the concentration of pentaiodide ions $I_5^-$ is maintained.

Referring to FIG. 8, the triiodide ions $I_3^-$ absorb more blue light than the pentaiodide ions $I_5^-$ at a blue light absorption wavelength (450 nm).

It can also be seen that the triiodide ions $I_3^-$ react sensitively to small concentration changes compared to the pentaiodide ions $I_5^-$ at the blue light absorption wavelength (450 nm) and the amount of variation in the transmittance of blue light is large.

Hence, it is revealed that, when the ratio of the concentration of triiodide ions $I_3^-$ to the concentration of pentaiodide ions $I_5^-$ is reduced compared to the conventional polarizing plate with 43% transmittance, the transmittance was increased.

It is also revealed that, when high transmittance is achieved, the blue light transmittance is increased compared to red and blue light. For example, the polarizing plate with 45% transmittance increased in red and green transmittance by about 105% and increased in blue transmittance by about 111%, compared to the conventional polarizing plate. Moreover, when blue tuning is added, the overall transmittance may be increased, including the blue light transmittance.

For a typical polarizing plate, the ratio of triiodide ions $I_3^-$:iodide $I_2$:pentaiodide ions $I_5^-$ may be about 20:40:40. By contrast, for a blue-tuned, very highly transmissive polarizing plate according to the present disclosure, the ratio of triiodide ions $I_3^-$:iodide $I_2$:pentaiodide ions $I_5^-$ may be about 15:40:45 to 19:40:41, or 15:40:45.

If the ratio of triiodide ions $I_3^-$ is lower than 15%, it gives a strong bluish tint and makes the color reflected from the display panel appear bluish, which is difficult to be applicable. On the other hand, if the ratio of triiodide ions $I_3^-$ is higher than 25%, it gives a strong reddish tint and makes the color reflected from the display panel appear reddish, which is difficult to be applicable. Thus, the appropriate ratio of triiodide ions $I_3^-$ is 15% or higher and lower than 20%.

Figure 9:
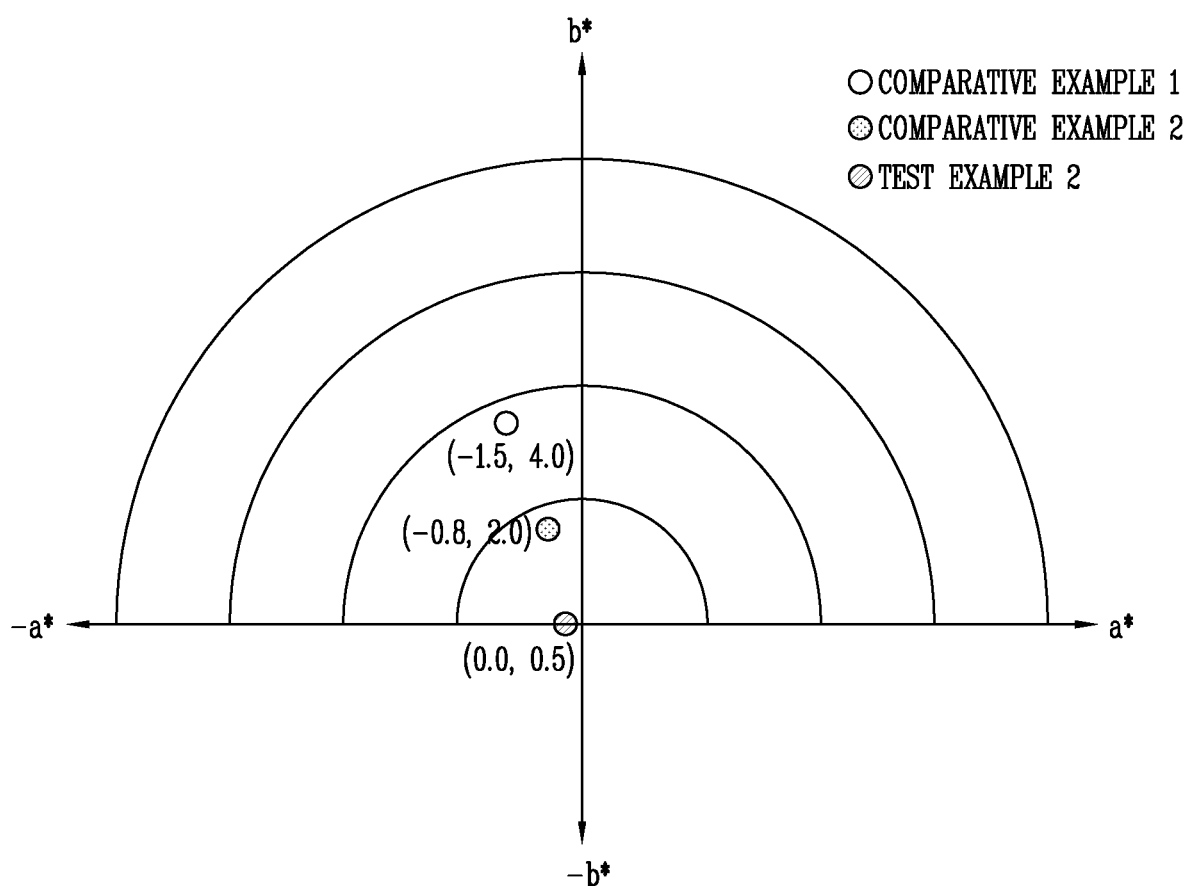
FIG. 9 is a view showing a color enhancement of a polarizing plate according to an aspect of the present disclosure.

FIG. 9 is a view showing a color enhancement to a polarizing plate according to an aspect of the present disclosure.

Figure 10:
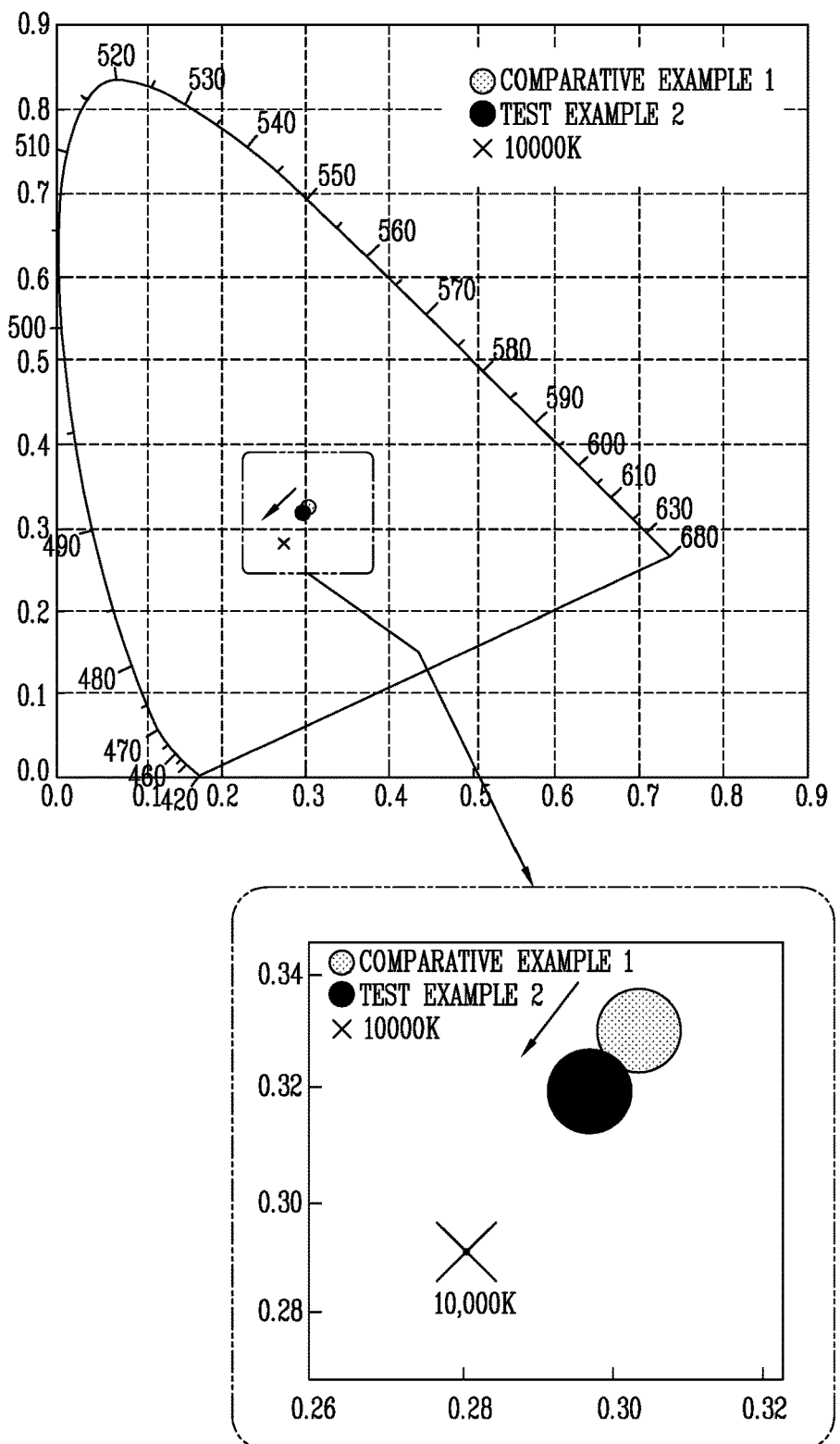
FIG. 10 is an illustration showing color temperature characteristics of a polarizing plate according to an aspect of the present disclosure, using chromaticity coordinates.

FIG. 10 is an illustration showing the color temperature characteristics of a polarizing plate according to an aspect of the present disclosure, using the chromaticity coordinates.

The color enhancement to the polarizing plate according to an aspect of the present disclosure can be indicated by RGB color coordinates. The RGB color coordinates represent the red, green, and blue color coordinates on the XY color space in the maximum red, green, and blue luminance condition.

Comparative Examples 1 and 2 are given for the polarizing plates with 43% and 45% transmittance shown in FIG. 7, and Test Example 2 is given for the polarizing plate with 48% transmittance according to an aspect of the present disclosure shown in FIG. 7.

Referring to FIG. 9, the chromaticity coordinates a*/b* of the polarizing plate of Comparative Example 1 are −1.5/4.0 and the chromaticity coordinates a*/b* of the polarizing plate of Comparative Example 2 are −0.8/2.0, whereas the chromaticity coordinates a*/b* of the polarizing plate of Test Example 2 are 0.0/0.5. That is, it can be seen that b* was reduced due to the reduction in the concentration of triiodide ions $I_3^-$ caused by blue tuning.

Referring to FIG. 10, the white sub-pixel color temperatures in Comparative Example 1 and Test Example 2 are 6800K and 7500K, respectively, relative to the target temperature 10000K.

It can be seen that, when blue tuning is applied, the white sub-pixel color temperature of the organic light-emitting display device increases towards the target color temperature 10000K.

This reveals that the increase in the transmittance of the polarizing plate can contribute to the improvement of the efficiency of the organic light-emitting display—for example, when the transmittance is increased by 5%, the efficiency is improved by about 5%. Thus, it can be found out that the blue tuning of the polarizing plate can cause an increase in the color temperature of the white sub-pixel, and this reduces the blue current, yielding an about 5% improvement in efficiency.

In the case of an organic light-emitting display device including four WRGB sub-pixels, the white sub-pixel is driven to achieve a full-white specification (brightness/color temperature). In this case, 80% or more of the electric current used for displaying full white is an electric current required for white emission.

In an example, when a luminance of about 100 nits is required for full-white brightness under a color temperature of 10000K, the white sub-pixel and the red and blue sub-pixels of a typical organic light-emitting display (Comparative Example) having a polarizing plate with 43% transmittance consume about 60% and 40% of the current, respectively. On the other hand, the white sub-pixel and the red and blue subpixels of an organic light-emitting display having a polarizing plate with 45% transmittance consume about 56% and 34% of the current, respectively, which yields a 10% decrease in overall electrical current compared to Comparative Example. That is, it can be seen that, as compared to Comparative Example, the increase in the transmittance of the polarizing plate can bring about a current decrease of about 7% for the white sub-pixel and the increase in the transmittance of the polarizing plate, and the blue tuning can bring about a current decrease of about 15% for the red and blue sub-pixels.

As seen above, the present disclosure enables a longer device lifetime since the increase in the transmittance of the polarizing plate and the blue tuning bring about a decrease in the electrical current required for the device. That is, the higher the amount of light emission from the device, the higher the rate of decrease in the device's lifetime. The increase in the transmittance of the polarizing plate and the blue tuning can cause an increase in luminance efficiency, and this reduces the current required for the device, thus yielding a longer device lifetime.

FIGS. 11A to 11C are tables showing luminance efficiency characteristics for different transmittance rates of polarizing plates.

FIG. 11A describes the polarizing plate of Comparative Example 1 with 43% transmittance. FIG. 11B describes the polarizing plate of Comparative Example 2 with 45% transmittance. FIG. 11C describes the polarizing plate of Test Example 1 with 48% transmittance.

The R, G, B, Ws, and W(F/W) indicated in FIGS. 11A to 11C represent red sub-pixel operation, green sub-pixel operation, green sub-pixel operation, white sub-pixel operation, and full-color (WRGB) operation.

FIG. 12 is a table showing the degree of polarization, reflectance, and afterimage duration of a polarizing plate according to an aspect (Test Example 1) of the present disclosure, which shows a comparison with the above-described polarizing plates of Comparative Examples 1, 2, and 3.

Referring back to FIGS. 11A to 11C, in full-color (WRGB) operation, Comparative Examples 1 and 2 and Test Example 1 exhibited a luminance efficiency of about 18.60 cd/A, 20.84 cd/A, and 23.71 cd/A, respectively, and Test Example 1 exhibited an increase of about 127% in luminance efficiency compared to Comparative Example 1.

It can also be seen that, as compared to Comparative Example 1, the relative luminance efficiency of Example 1 was increased by 115%, 117%, 122%, and 113% for the red, green, blue, and white sub-pixels, respectively.

Referring to FIG. 12, the polarizing plate of Comparative Example 1 with 42.8% transmittance (by actual measurement) has a degree of polarization of 99.99%, and the polarizing plate of Comparative Example 2 with 44.8% (by actual measurement) has a degree of polarization of 99.8%. It can also be seen that the polarizing plate of Comparative Example 3 with 48.0% transmittance (by actual measurement) has a degree of polarization of 85.0%, and the polarizing plate of Test Example 1 with 48.0% (by actual measurement) has a degree of polarization of 89.9%.

The transmittance of a polarizing plate may be changed depending on the amount of iodine, stretching conditions, etc., and there is a trade-off between transmittance and polarization—that is, the higher the transmittance, the lower the polarization. In Test Example 1 where blue-tuning was carried out, the polarization was improved from 85.0 to 89.9% at the same transmittance.

For example, in the case of an organic light-emitting display with a 30 to 40% panel reflectance, the polarizing plate of Comparative Example 1 has a reflectance of 0.9%, and the polarizing plate of Comparative Example 2 has a reflectance of 1.2%. Also, while the polarizing plate of Comparative Example 3 has a reflectance of 3.6%, the polarizing plate of Test example 1 has a reflectance of 2.5%.

In the case of an organic light-emitting display having a panel with a low reflectance of 15 to 25%, the polarizing plate of Comparative Example 1 has a reflectance of 0.9%, and the polarizing plate of Comparative Example 2 has a reflectance of 1.0%. Also, while the polarizing plate of Comparative Example 3 has a reflectance of 1.9%, the polarizing plate of Test example 1 has a reflectance of 1.6%.

The afterimage durations of the polarizing plates of Comparative Example 2 and Test Example 1 were improved by about 110% and 124%, respectively, compared to the polarizing plate of Comparative Example 1.

As seen above, the present disclosure provides a very highly transmissive polarizing plate with improved luminance efficiency without reducing the degree of polarization by enhancing the color of the polarizing plate. As a result, the present disclosure can improve the brightness of the organic light-emitting display device, thereby achieving a longer lifetime and efficiency and reducing power consumption.

Moreover, the present disclosure can improve the reliability of the polarizing plate by controlling the ratio of dye to iodine or the ratio of additives to iodine. This will be described in detail with reference to the drawings.

FIG. 13 is a table showing reliability results for different iodine contents and dye contents.

FIG. 13 shows results of a reliability test performed with varying ratios of dye to iodine of 100:0, 99.0:1.0, 98.3:1.7, 97.2:2.8, and 96.4:3.6.

The reliability test was carried out for 500 hours at a high temperature of about 80° C., for example, and when the change in transmittance before and after the reliability test is no more than 3%, the reliability may be rated as OK.

Referring to FIG. 13, when the ratio of dye to iodine is 100:0 and 99.0:1.0, the change in transmittance is measured at 9.0% and 6.0% and the reliability may be rated as NG.

On the other hand, when the ratio of dye to iodine is 98.3:1.7, 97.2:2.8, and 96.4:3.6, the change in transmittance is measured at 2.2%, 1.5%, and 1.3% and the reliability may be rated as OK.

From above, it can be seen that, when a dye is added at about 1.7% or more, the reliability may be rated as OK based on the change in transmittance and amount of smudges before and after the reliability test.

The dye used is a black dye, which is obtained by mixing three or more dyes of CMY (or RGB) colors.

FIG. 14 is a table showing reliability results for different additive contents.

FIG. 14 shows results of a reliability test performed with increasing additive contents of 0%, 1.3%, 2.1%, 3.5%, and 4.8%.

Metal compounds such as zinc (Zn), chlorine (Cl), and platinum (Pt) may be used as the additives.

For example, the zinc compounds may include zinc chloride, zinc iodide, zinc sulfate, zinc nitride, zinc acetate, etc.

Furthermore, various compounds containing silver (Ag) or platinum may be used.

These additives may be added to poly(vinyl alcohol) (PVA), along with a dye, in an iodine dyeing process.

Referring to FIG. 14, when additives are added at a rate of 0 to 2.1%, the change in transmittance is measured at 8.6 to 4.3% and the reliability may be rated as NG.

On the other hand, when additives are added at rates of 3.5% and 4.8%, the change in transmittance is measured at 2.4% and 2.0%, respectively, and the reliability may be rated as OK.

From above, it can be seen that, when the additive content is increased by 3.5% or higher, the reliability may be rated as OK based on the change in transmittance and amount of smudges before and after the reliability test.

FIG. 15 is a table showing reliability results for different stretch ratios.

FIG. 15 shows results of a reliability test performed with varying stretch ratios of 1, 1.05, 1.1, and 1.15.

The stretch ratio $(I-I_0)/I_0$ is the ratio of the extended length $I-I_0$ divided by the initial length $I_0$.

Referring to FIG. 15, when the stretch ratio is 1 to 1.1, the change in transmittance is measured at 9.0 to 5.5% and the reliability may be rated as NG.

Moreover, when the stretch ratio is 1.15, the change in transmittance is measured at 4.5%, it can be seen that the reliability increases with increasing stretch ratio.

Although the description above contains many details, it should not be construed as limiting the scope of the disclosure but as merely providing illustrations of some exemplary aspects of the present disclosure. Thus, the scope of the present disclosure should be determined by the appended claims and their equivalents, rather than by the examples given.

What is claimed is:

1. A polarizing plate having a transmittance of 46% or higher, comprising:
   a plurality of triiodide ions ($I_3^-$), iodine ($I_2$), and pentaiodide ions ($I_5^-$),
   wherein a ratio of the triiodide ions to the iodine to the pentaiodide ions (($I_3^-$):($I_2$):($I_5^-$)) is 15:40:45 to 19:40:41.

2. The polarizing plate of claim 1, wherein chromaticity coordinates a*/b* have values of −0.5/1.5 to 0.0/0.0.

3. The polarizing plate of claim 1, further comprising a dye in the iodine at a rate of 1.7% or more.

4. The polarizing plate of claim 3, wherein the dye includes a black dye, having three or more dyes of CMY (or RGB) colors.

5. The polarizing plate of claim 1, further comprising additives in the iodine at a rate of 3.5% or more.

6. The polarizing plate of claim 5, wherein the additives comprise a metal compound.

7. The polarizing plate of claim 6, wherein the metal compound comprises one of a zinc (Zn) compound, a chlorine (Cl) compound, and a platinum (Pt) compound.

8. The polarizing plate of claim 7, wherein the metal compound comprises a zinc (Zn) compound, and wherein the zinc compound comprises one of zinc chloride, zinc iodide, zinc sulfate, zinc nitride, and zinc acetate.

9. The polarizing plate of claim 1 having a transmittance of 48% or higher.

10. An optical member for an organic light-emitting display device having a transmittance of 46% or higher, comprising:
    a substrate;
    a polarizing plate disposed over the substrate and having comprising a plurality of triiodide ions ($I_3^-$), iodine ($I_2$), and pentaiodide ions ($I_5^-$),
    wherein a ratio of the triiodide ions to the iodine to the pentaiodide ions (($I_3^-$):($I_2$):($I_5^-$)) is 15:40:45 to 19:40:41; and
    a phase difference layer on the polarizing plate.

11. The optical member of claim 10, wherein the phase difference layer comprises a quarter-wave plate (QWP) inducing a λ/4 phase retardation.

12. The optical member of claim 10, wherein chromaticity coordinates a*/b* have values of −0.5/1.5 to 0.0/0.0.

13. The optical member of claim 10, further comprising a dye in the iodine at a rate of 1.7% or more.

14. The optical member of claim 13, wherein the dye includes a black dye having three or more dyes of CMY (or RGB) colors.

15. The optical member of claim 10, further comprising additives in the iodine at a rate of 3.5% or more.

16. The optical member of claim 15, wherein the additives comprise a metal compound.

17. The optical member of claim 16, wherein the metal compound comprises one of a zinc (Zn) compound, a chlorine (Cl) compound, and a platinum (Pt) compound.

18. The polarizing plate of claim 17, wherein the metal compound comprises a zinc (Zn) compound, and wherein the zinc compound comprises one of zinc chloride, zinc iodide, zinc sulfate, zinc nitride, and zinc acetate.

19. The optical member of claim 10, further comprising a surface treatment layer between the polarizing plate and the substrate.

20. The optical member of claim 10 having a transmittance of 48% or higher.

* * * * *